Jan. 24, 1967 TOMIYUKI TANAKA 3,300,736
FREQUENCY MODULATION SYSTEM
Filed Dec. 20, 1963
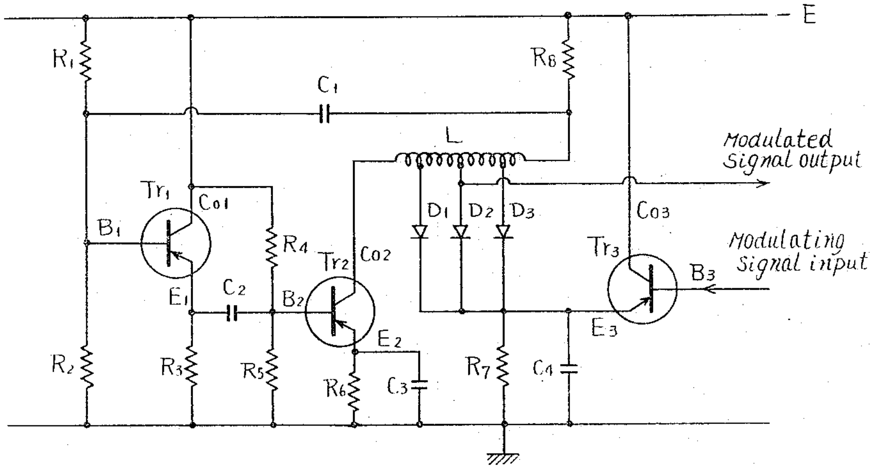
INVENTOR
Tomiyuki Tanaka
BY Stevens, Davis, Miller & Mosher
ATTORNEYS United States Patent Office 3,300,736

Patented Jan. 24, 1967

3,300,736

FREQUENCY MODULATION SYSTEM

Tomiyuki Tanaka, Tokyo, Japan, assignor to Victor Company of Japan Limited, Yokohama, Japan, a corporation of Japan Filed Dec. 20, 1963, Ser. No. 332,027
2 Claims. (Cl. 332—30)

The present invention relates to improvements in a frequency modulation system wherein use is made of a variable delay circuit.

Conventional transistorized frequency modulation systems make use of means for varying an emitter voltage or a collector voltage of an oscillator to change an equivalent capacity across the emitter and collector electrodes, or means for using a transistor as a reactance element, or means for utilizing a high frequency phase shifting of $\beta$ of a transistor, or means for using a variable capacity element in a tuning circuit of an oscillator. These conventional frequency modulation systems are difficult to shift the frequency over a wide range, so that application thereof is limited only to a wireless microphone, an automatic frequency control, etc.

An object of the invention is to obviate the above disadvantages and provide a frequency modulation system wherein a frequency shifting is performed over a wide range by merely increasing the number of delay elements without depending upon constants of a transistor circuit.

For a better understanding of the invention, reference is taken to the accompanying drawing, of which a single figure is the circuit diagram of an embodiment of the invention.

Referring to the drawing, a variable delay circuit consists of elements L, $D_1$, $D_2$ and $D_3$. An oscillator circuit is closed from the variable delay circuit through a coupling condenser $C_1$, a base $B_1$ and emitter $E_1$ of a transistor $Tr_1$ and a condenser $C_2$ to a base $B_2$ of a transistor $Tr_2$. Oscillations produced by this oscillator circuit are amplified by the transistor $Tr_2$ and pass through a feed-back loop connected to the variable delay circuit. This feed-back loop is adapted to make the frequency of the oscillations twice the delay time of the circuit arrangement as a whole, said delay time being substantially determined by the delay circuit of L, $D_1$, $D_2$ and $D_3$. A collector-ground connection is adapted for a collector $Co_1$ of the transistor $Tr_1$ in order to give a high impedance to the feed-back voltage. $R_1$, $R_2$ and $R_3$ are bias resistors for the transistor $Tr_1$ and serve not only to improve the stability of the transistor $Tr_1$, but also to operate the transistor $Tr_1$ at an electric power consumption less than a specified permissible value. $C_1$ is a coupling condenser connected between the transistors $Tr_1$ and $Tr_2$. The transistor $Tr_2$ is adapted to operate as an amplifier. The base $B_1$ of the transistor $Tr_1$ and the base $B_2$ of the transistor $Tr_2$ are in phase in polarity, while the base $B_2$ of the transistor $Tr_2$ is opposite with respect to the collector $Co_2$ due to the collector-ground connection.

As above mentioned, the signal shifted in phase by means of the variable delay circuit of L, $D_1$, $D_2$ and $D_3$ connected to the collector $Co_2$ of the transistor $Tr_2$ is fed-back to the base $B_1$ of the transistor $Tr_1$, thereby forming an oscillator. $R_4$, $R_5$ and $R_6$ are bias resistors for the transistor $Tr_2$ and serve in a manner similar to the resistors $R_1$, $R_2$ and $R_3$ for the transistor $Tr_1$. A condenser $C_3$ serves to connect, in high frequency, the emitter $E_2$ of the transistor $Tr_2$ to ground for the purpose of improving the amplification factor of the transistor $Tr_2$. A transistor $Tr_3$ is adapted to operate as a driver for driving the variable delay circuit of L, $D_1$, $D_2$ and $D_3$. $R_7$ and $R_8$ are load resistors for transistors $Tr_3$ and $Tr_2$ respectively. It is necessary to vary the reverse voltage applied across each of the diodes $D_1$, $D_2$ and $D_3$ in proportion to the modulating signal for the purpose of varying the amount of delay.

For this end, the collector voltage of the transistor $Tr_2$ is supplied to one terminal of each of the diodes $D_1$, $D_2$ and $D_3$, while the emitter voltage of the transistor $Tr_3$ is supplied to another terminal of each of the diodes $D_1$, $D_2$ and $D_3$, said emitter voltage being superposed by the modulating signal supplied from a modulating signal input terminal. This modulating signal input terminal is connected to the grounded side of the delay circuit of L, $D_1$, $D_2$ and $D_3$ and must have a sufficiently low impedance for the high frequency. The impedance for this modulating signal input terminal is less than a hundred ohms, because this modulating signal input terminal is connected to the variable delay circuit by the transistor $Tr_3$ in the emitter follower connection.

Moreover, a condenser $C_4$ having a capacity of the order, which is sufficient not to degrade the character of the modulating signal, is connected to the emitter of the transistor $Tr_3$ and the modulating signal input terminal, thereby decreasing the impedance of the modulating signal input terminal. In this way, a modulated output signal is obtained from, for example, one end of the variable capacitance $D_2$ and this system can obviate unfavorable effects to the circuit of transistor $Tr_2$ given by other circuit impedance which is receiving the modulated output signal.

As abovementioned, the present invention makes it possible to perform frequency shifting over a wide range by increasing the number of the delay elements and improve the frequency stability without having a direct relation with the constant of the transistor circuit contrary to the oscillator used in the conventional frequency modulation system.

What I claim is:

1. A frequency modulation system comprising a variable delay circuit comprising an inductor and a plurality of variable capacitors which are varied by the voltage applied thereto shunted by said inductor, means for directly supplying a voltage corresponding to an input modulating signal, including a direct current component, directly to like ends of each of said capacitors, and an oscillation circuit connected to said delay circuit which oscillates by feeding back a signal which is phase shifted by said delay circuit, the delay time of said variable delay circuit being varied by the capacity of said variable capacitors which are varied by a voltage corresponding to said input modulating signal and the oscillation frequency of said oscillation circuit being phase shifted.

2. A frequency modulation system comprising a variable delay circuit comprising an inductor and at least three variable capacitors, the capacity of which can be varied by a voltage shunted by said inductor, means for supplying a voltage corresponding to an input modulating signal, including a direct current component, directly to like ends of each of said capacitors, an oscillation circuit connected to said delay circuit which oscillates by feeding back a signal which is phase shifted by said delay circuit, and means for taking out a modulated signal from about the center of said variable delay circuit, the delay time of said variable delay circuit being changed by which the capacity of said variable capacitors are varied by the voltage corresponding to said input modulating signal and the oscillation frequency of said oscillation circuit being phase shifted.

References Cited by the Examiner

UNITED STATES PATENTS

| | | | |
|---|---|---|---|
| 2,085,418 | 6/1937 | Crosby | 332—19 X |
| 2,486,265 | 10/1949 | Dennis | 331—135 |
| 2,925,563 | 2/1960 | Firestone | 332—30 |
| 3,054,971 | 9/1962 | Khu | 331—137 X |

FOREIGN PATENTS

| | | |
|---|---|---|
| 914,395 | 7/1954 | Germany. |

ROY LAKE, *Primary Examiner.*

ALFRED L. BRODY, *Assistant Examiner.*